(12) United States Patent
Lin et al.

(10) Patent No.: US 11,357,097 B2
(45) Date of Patent: Jun. 7, 2022

(54) HIGH PERFORMANCE THERMAL SOLUTION CONCEPT FOR SURFACE MOUNT DEVICE PACKAGES

(71) Applicant: Flex Ltd., Singapore (SG)

(72) Inventors: Yung You Lin, New Taipei (TW); Lien Jin Chiang, New Taipei (TW); Hung Cheng Chang, New Taipei (TW)

(73) Assignee: Flex Ltd., Singapore (SG)

( * ) Notice: Subject to any disclaimer, the term of this patent is extended or adjusted under 35 U.S.C. 154(b) by 51 days.

(21) Appl. No.: 17/077,933

(22) Filed: Oct. 22, 2020

(65) Prior Publication Data

US 2022/0132651 A1    Apr. 28, 2022

(51) Int. Cl.
*H05K 1/02* (2006.01)
*H05K 1/18* (2006.01)

(52) U.S. Cl.
CPC ........... *H05K 1/0206* (2013.01); *H05K 1/181* (2013.01); *H05K 2201/066* (2013.01); *H05K 2201/10545* (2013.01)

(58) Field of Classification Search
CPC ........... H05K 1/0206; H05K 2201/066; H05K 2201/10545
USPC ....................................................... 361/704
See application file for complete search history.

(56) References Cited

U.S. PATENT DOCUMENTS

| 5,792,677 | A | * | 8/1998 | Reddy | ................. | H01L 23/3677 |
| | | | | | | 257/713 |
| 2006/0131732 | A1 | * | 6/2006 | Nah | ..................... | H05K 1/0206 |
| | | | | | | 257/706 |
| 2014/0211421 | A1 | * | 7/2014 | Mishrikey | ............ | H05K 1/0209 |
| | | | | | | 361/717 |
| 2015/0098176 | A1 | * | 4/2015 | Dean | ...................... | G06F 1/185 |
| | | | | | | 361/679.54 |
| 2015/0334870 | A1 | * | 11/2015 | Feng | ..................... | G06F 1/1696 |
| | | | | | | 235/462.21 |
| 2016/0049723 | A1 | * | 2/2016 | Baks | ..................... | H01Q 13/10 |
| | | | | | | 343/848 |

\* cited by examiner

*Primary Examiner* — Sherman Ng
(74) *Attorney, Agent, or Firm* — Sheridan Ross P.C.

(57) ABSTRACT

Heat management in electronic components is an important factor in managing the performance and longevity of such electronic components. By omitting a thermal interface layer and providing thermal vias between a heatsink and an electronic component, such as a surface mount technology (SMT) package, such components may improve thermal transfer to the heatsink and simplify assembly. Thermal vias may be fused during reflow to the heatsink and/or electronic component. As a benefit to the improved heat transfer provided, electronic components may operate at a lower temperature or be configured to perform greater heat-producing activities.

13 Claims, 3 Drawing Sheets

US 11,357,097 B2

HIGH PERFORMANCE THERMAL SOLUTION CONCEPT FOR SURFACE MOUNT DEVICE PACKAGES

FIELD OF THE DISCLOSURE

The present disclosure is generally directed toward electronic packages and more specifically to structures and methods providing to improve heat dissipation and thermal management.

BACKGROUND

Managing heat generated by electronic components is an important task to ensure the components are damaged by the heat they generate as they perform their operations. The cooler a component can operate, the more options are provided to decrease package footprint, increase the number or speed of operations provided by the electronic component, and improve long-term reliability of the component.

Prior art management of heat from surface mount device (SMDs) utilize a thermal interface material (TIM) between the SMD and the heatsink to help spread the heat out and transfer heat away from the SMD. Thermal performance and cost will depend on the thermal conductivity of the TIM selected.

SUMMARY

It is with respect to the above issues and other problems that the embodiments presented herein were contemplated.

In one embodiment, a thermal solution is disclosed comprising a Surface Mount Technology (SMT) heatsink and SMD component(s) placed opposite of each other with a PCB therebetween. The PCB is provided with thermal vias to provide heat transfer paths from the component to the heatsink. As a result, TIM may be reduced or eliminated entirely.

Heat is transferred from component to PCB by the thermal vias then passed to SMT heatsink directly. As a benefit, the whole thermal resistance is lower than traditional thermal solution (TIM+heatsink). Which means the heat could be spread out more effectively and uniformly. Embodiments have been tested and improvements of 3-5 degrees C. have been observed.

In one embodiment, a printed circuit board (PCB) is disclosed, comprising: a core having a first side and a second side and comprising a number of electrical traces; an electronic component attached to the first side of the core and electrically connected to the number of electrical traces; a heatsink attached to the second side of the core and opposite the electronic component; a number of thermal vias between the first side and the second side and thermally connecting the electronic component to the heatsink; and wherein the heatsink is physically and directly attached to the electronic component by the number of thermal vias.

In another embodiment, an electronic component, comprising: a number of thermal vias attached at a proximate end to one planar surface of the electronic component; a heatsink attached to a distal end of the number of thermal vias; and a printed circuit board (PCB) disposed between the heatsink and the electronic component and comprising openings therethrough that accommodate the number of thermal vias; and wherein no thermal interface material is provided between the heatsink and the electronic component.

In another embodiment, a heatsink is disclosed, comprising; a first side to receive thermal energy; a second side, opposite the first side, to expose the thermal energy to an environment; a number of thermal vias attached at a proximate end to the first side of the heatsink; an electronic component attached to the distal end of the number of thermal vias; a printed circuit board (PCB) disposed between the heatsink and the electronic component and comprising openings therethrough that accommodate the number of thermal vias; and wherein no thermal interface material is provided between the heatsink and the electronic component.

The phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B, and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The terms "determine," "calculate," and "compute," and variations thereof, as used herein, are used interchangeably and include any type of methodology, process, mathematical operation, or technique.

The term "module," as used herein, refers to any known or later-developed hardware, software, firmware, artificial intelligence, fuzzy logic, or combination of hardware and software that is capable of performing the functionality associated with that element. Also, while the disclosure is described in terms of exemplary embodiments, it should be appreciated that other aspects of the disclosure can be separately claimed.

BRIEF DESCRIPTION OF THE DRAWINGS

The present disclosure is described in conjunction with the appended figures.

DETAILED DESCRIPTION

The ensuing description provides embodiments only and is not intended to limit the scope, applicability, or configuration of the claims. Rather, the ensuing description will provide those skilled in the art with an enabling description for implementing the embodiments. It will be understood that various changes may be made in the function and arrangement of elements without departing from the spirit and scope of the appended claims.

Any reference in the description comprising a numeric reference number, without an alphabetic sub-reference identifier when a sub-reference identifier exists in the figures, when used in the plural, is a reference to any two or more elements with a like reference number. When such a reference is made in the singular form, but without identification of the sub-reference identifier, is a reference one of the like numbered elements, but without limitation as to the particular one of the elements. Any explicit usage herein to the contrary or providing further qualification or identification shall take precedence.

The exemplary systems and methods of this disclosure will also be described in relation to analysis software, modules, and associated analysis hardware. However, to avoid unnecessarily obscuring the present disclosure, the following description omits well-known structures, components, and devices, which may be omitted from or shown in a simplified form in the figures or otherwise summarized.

For purposes of explanation, numerous details are set forth in order to provide a thorough understanding of the present disclosure. It should be appreciated, however, that the present disclosure may be practiced in a variety of ways beyond the specific details set forth herein.

Figure 1:
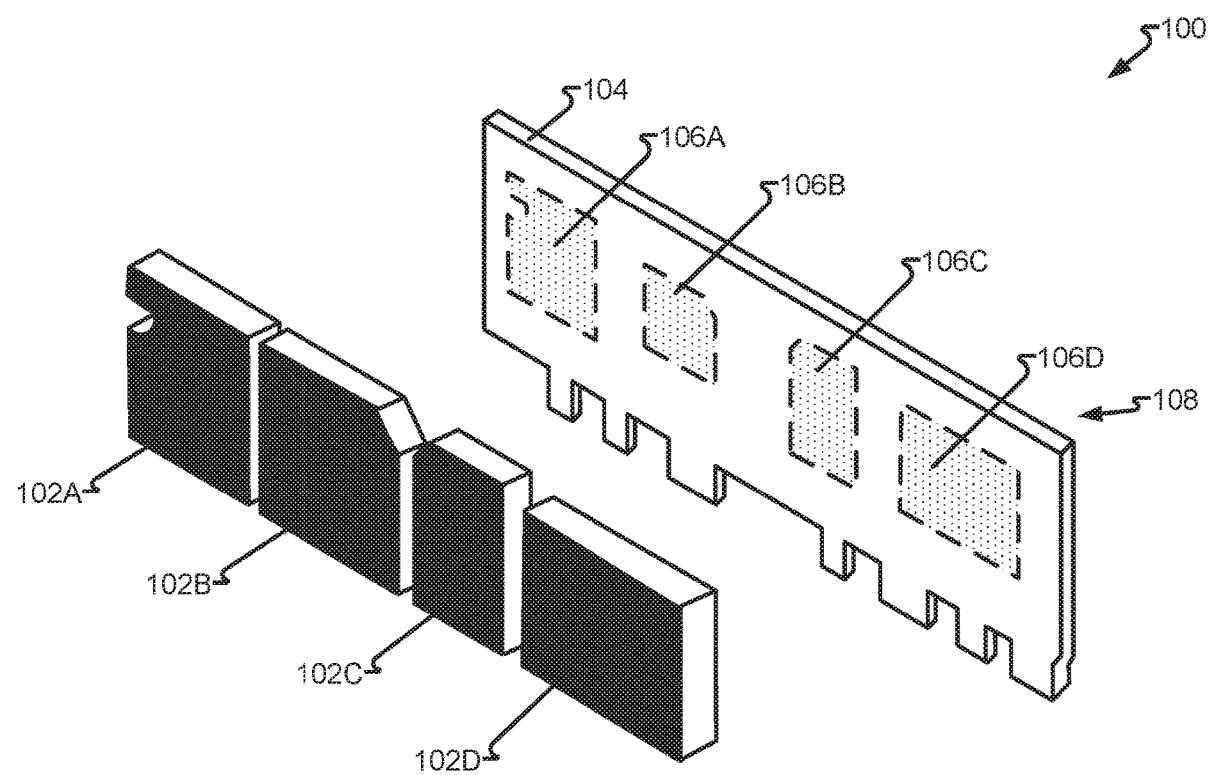
FIG. 1 depicts a partially exploded view of a PCB in accordance with embodiments of the present disclosure.

FIG. 1 depicts partially exploded view 100 of PCB 104 in accordance with embodiments of the present disclosure. In one embodiment, PCB 104 is provided with via regions 106A-106D substantially within the footprint of electronic component 108 (not visible) on the opposing side of PCB 104. Electronic component 108 may comprise a single or plurality of discrete components attached (e.g., wave solder, reflow, etc.) to PCB 104. Additionally or alternatively, electronic component 108 may be embodied as an SMT component. Via regions 106A-106D comprise a number of thermal vias which may be directly fused to electronic component and/or heat sink 102A-102D.

Heatsink 102A-102D may comprise a metal selected for heat conductivity and adhesion to thermal vias and, optionally for other property. For example, heatsink 102A-102D may comprise aluminum or copper although other metals may be utilized. One or more heatsink 102A-102D may be provided with groves or fins to increase the surface area of the one or more of heatsink 102A-102D. In yet another embodiment, a fan may be provided on or near heatsink 102A-102D to further promote heat dissipation therefrom.

In another embodiment, one or more of heatsink 102A-102D may be provided with an electrical potential. The electrical potential, via a thermal via also utilized for electrical connectivity, or dedicated electrical vias, provide electronic component 108 with the electrical potential. Heatsink 102A-102D may provide differing heatsink, such as one of heatsink 102A-102D may be positive, another may be negative, another may be neutral (bus, chassis, and/or Earth ground), or a second voltage different from a first potential provided by a different heatsink 102.

PCB 104 comprises a plurality of electrical traces (not show) to provide power and/or data signals to electrical component 108. PCB 104 may have additional contacts, such as exposed contact pads, electrical sockets, hardwire, etc. to engage wiring of external components for power and/or data signals. When one or more of heatsinks 102A-102D provide a voltage to one or more corresponding electronic component(s) 108, the voltage may be provided to heatsink 102 via a trace within PCB 104. Additionally or alternatively, heatsink 102 may have a direct connection (e.g., socket, hardwire, contact, etc.) to an external voltage source.

Figure 2:
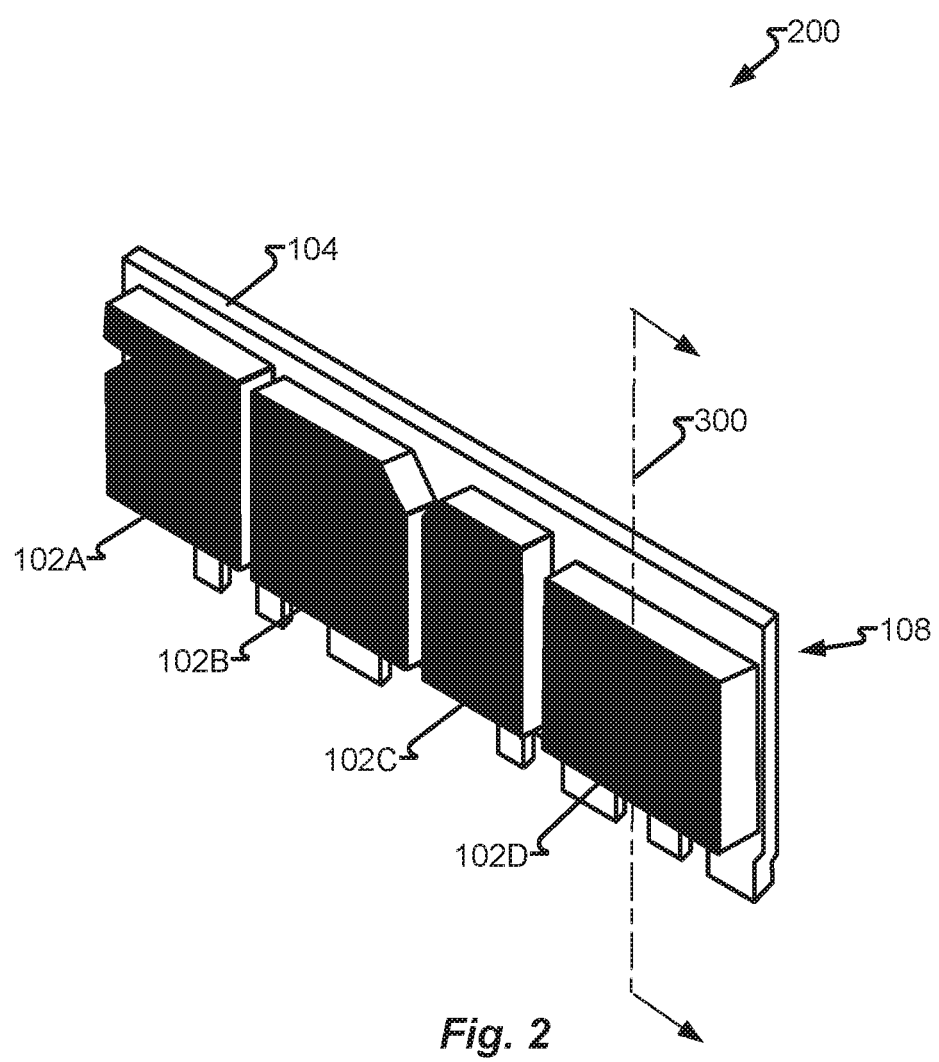
FIG. 2 depicts assembled view of the PCB in accordance with embodiments of the present disclosure.

FIG. 2 depicts assembled view 200 of PCB 104 in accordance with embodiments of the present disclosure. Heatsink 102, or illustrated in assembled view 200 as heatsinks 102A-102D) are affixed to PCB and electronic component 108. Notably absent is the presence of TIM between heatsinks 102A-102D) and electronic component 108. Only PCB 104 is provided therebetween in order to provide the physical support for heatsinks 102A-102D and electronic component 108 and house the conductive traces are provided therebetween.

The thermal vias provided in PCB 104 can comprise nearly any number and size, within the footprint of each heatsink 102 and electronic component 108. While, in one embodiment, one large thermal via may be provided, wiring to the pins of electronic component 108 necessitates the use of a plurality of smaller thermal vias in order to accommodate the electrical vias and conductive traces utilized by electronic component 108. Thermal vias may be provided as a metal paste or similar reflowable compound and, once heated, fused to a corresponding surface, such as heatsink(s) 102 and/or electronic component 108.

Figure 3:
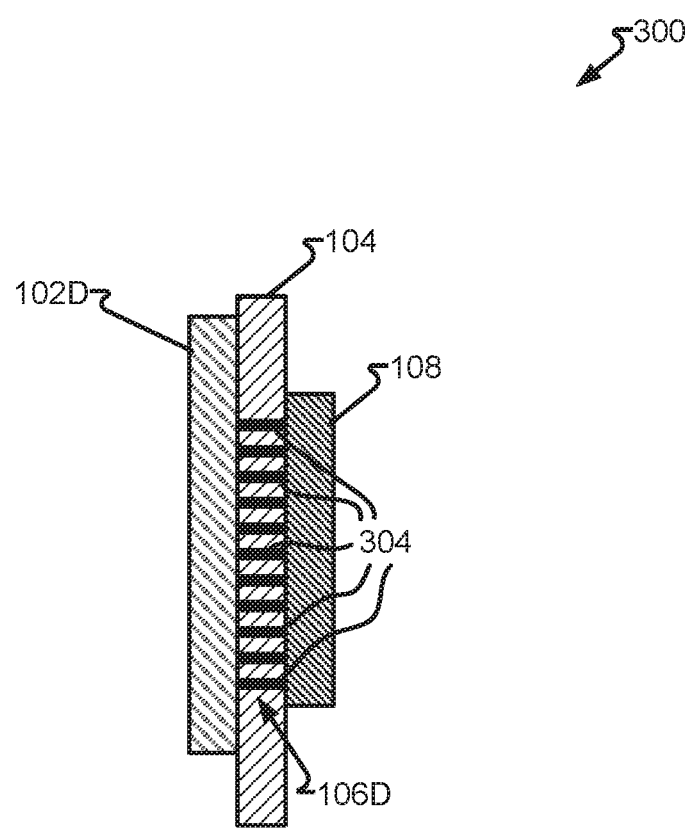
FIG. 3 depicts a cross sectional view of the PCB in accordance with embodiments of the present disclosure.

Cross sectional view 300 of PCB 104 is provided in FIG. 3.

FIG. 3 depicts cross sectional view 300 of the PCB in accordance with embodiments of the present disclosure. In one embodiment, heatsink 102D is attached to electronic component 108 via a number of thermal vias 304. Thermal vias 304 are fused to electronic component 108 via reflow or similar process at one end (i.e., a proximate end from the perspective of electronic component 108) and at heatsink 102D at the distal end (from the perspective of the electronic component 108). PCB 104 provides a network of openings to accommodate thermal vias 304 within via region 106D that is at least within the footprint of electronic component 108 when mounted to PCB 104.

In the foregoing description, for the purposes of illustration, methods were described in a particular order. It should be appreciated that in alternate embodiments, the methods may be performed in a different order than that described without departing from the scope of the embodiments. It should also be appreciated that the methods described above may be performed as algorithms executed by hardware components (e.g., circuitry) purpose-built to carry out one or more algorithms or portions thereof described herein. In another embodiment, the hardware component may comprise a general-purpose microprocessor (e.g., CPU, GPU) that is first converted to a special-purpose microprocessor. The special-purpose microprocessor then having had loaded therein encoded signals causing the, now special-purpose, microprocessor to maintain machine-readable instructions to enable the microprocessor to read and execute the machine-readable set of instructions derived from the algorithms and/or other instructions described herein. The machine-readable instructions utilized to execute the algorithm(s), or portions thereof, are not unlimited but utilize a finite set of instructions known to the microprocessor. The machine-readable instructions may be encoded in the microprocessor as signals or values in signal-producing components and included, in one or more embodiments, voltages in memory circuits, configuration of switching circuits, and/or by selective use of particular logic gate circuits. Additionally or alternative, the machine-readable instructions may be accessible to the microprocessor and encoded in a media or device as magnetic fields, voltage values, charge values, reflective/non-reflective portions, and/or physical indicia.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A printed circuit board (PCB), comprising:
a core having a first side and a second side and comprising a number of electrical traces;
an electronic component attached to the first side of the core and electrically connected to the number of electrical traces;
a heatsink attached to the second side of the core and opposite the electronic component; and
a number of thermal vias between the first side and the second side and thermally connecting the electronic component to the heatsink;
wherein the heatsink is physically and directly attached to the electronic component by the number of thermal vias; wherein the PCB omits any thermal interface material between the heatsink and the electronic component; wherein the number of thermal vias are attached to the heatsink after heating the PCB to cause the number of thermal vias to reflow and fuse to the heatsink; and wherein the number of thermal vias are attached to the electronic component after heating the PCB to cause the number of thermal vias to reflow and fuse to the electronic component.

2. The PCB of claim 1, wherein:
the electronic component comprises a plurality of electronic components; and
the heatsink comprises a plurality of heatsinks, each of the plurality of heatsinks mounted on the second side and opposing a corresponding one of the plurality of electronic components.

3. The PCB of claim 2, wherein at least one of the plurality of heatsinks is provided with an electrical potential which in turn is provided to the corresponding one of the plurality of electronic components.

4. The PCB of claim 3, wherein at least one of the plurality of heatsinks is provided with a positive electric potential and a different one of the plurality of heatsinks is provided with a negative electric potential.

5. The PCB of claim 1, wherein:
the electronic component comprises a plurality of electronic components; and
the heatsink comprises opposes two or more of the plurality of electronic components.

6. The PCB of claim 1, wherein the electronic component is a surface mount component.

7. An electronic component, comprising:
a number of thermal vias attached at a proximate end to one planar surface of the electronic component;
a heatsink attached to a distal end of the number of thermal vias; and
a printed circuit board (PCB) disposed between the heatsink and the electronic component and comprising openings therethrough that accommodate the number of thermal vias;
wherein no thermal interface material is provided between the heatsink and the electronic component; wherein the number of thermal vias are attached to the electronic component after heating to cause the number of thermal vias to reflow and fuse to the electronic component; and wherein the number of thermal vias are attached to the heatsink after heating to cause the number of thermal vias to reflow and fuse to the heatsink.

8. The electronic component of claim 7, wherein
the electronic component comprises a plurality of electronic components; and
the heatsink comprises a plurality of heatsinks, each of the plurality of heatsinks each opposing a corresponding one of the plurality of electronic components.

9. The electronic component of claim 8, wherein at least one of the plurality of heatsinks is provided with an electrical potential to at least one pin-out of the electronic component.

10. The electronic component of claim 7, wherein the electronic component is a surface mount component.

11. A heatsink, comprising;
a first side to receive thermal energy;
a second side, opposite the first side, to expose the thermal energy to an environment;
a number of thermal vias attached at a proximate end to the first side of the heatsink;
an electronic component attached to a distal end of the number of thermal vias;
a printed circuit board (PCB) disposed between the heatsink and the electronic component and comprising openings therethrough that accommodate the number of thermal vias;
wherein no thermal interface material is provided between the heatsink and the electronic component; wherein the number of thermal vias are attached to the heatsink after heating to cause the number of thermal vias to reflow and fuse to the heatsink; and wherein the number of thermal vias are attached to the heatsink and the electronic component after heating to cause the number of thermal vias to reflow and fuse to the electronic component and the heatsink.

12. The heatsink of claim 11, wherein the heatsink is provided with an electrical potential which in turn is provided to at least one pin-out of the electronic component.

13. The heatsink of claim 11, wherein the electronic component comprises a number of electronic components.

* * * * *